United States Patent [19]

Young

[11] Patent Number: 5,429,859
[45] Date of Patent: Jul. 4, 1995

[54] LTCC ALIGNMENT MARKS FOR MECHANICAL PARTS PLACEMENT

[75] Inventor: Brian D. Young, Austin, Tex.

[73] Assignee: Hughes Aircraft Company, Los Angeles, Calif.

[21] Appl. No.: 248,276

[22] Filed: May 24, 1994

[51] Int. Cl.⁶ ............................................. B32B 9/00
[52] U.S. Cl. ................................. 428/192; 428/209; 428/210; 428/901; 174/250
[58] Field of Search ............... 428/210, 209, 901, 192, 428/201

[56] References Cited

U.S. PATENT DOCUMENTS 5,266,380 11/1993 Renguso et al. ..................... 428/192

*Primary Examiner*—Patrick J. Ryan
*Assistant Examiner*—Kam F. Lee
*Attorney, Agent, or Firm*—Leonard A. Alkov; W. K. Denson-Low

[57] ABSTRACT

A unitized multilayer circuit structure including a plurality of planar dielectric insulating layers stacked in laminar fashion to form a substrate having sides, and at least one alignment groove formed in one side of the substrate.

4 Claims, 1 Drawing Sheet

LTCC ALIGNMENT MARKS FOR MECHANICAL PARTS PLACEMENT

BACKGROUND OF THE INVENTION

The subject invention is directed generally to unitized multilayer circuit structures, and more particularly to a unitized multilayer circuit structure that includes mechanically detectable alignment features that provide reference locations for automated placement of circuit devices in the unitized multilayer circuit structure.

Hybrid multilayer circuit structures, also known as hybrid microcircuits, implement the interconnection and packaging of discrete circuit devices, and generally include a unitized multilayer circuit structure formed from a plurality of integrally fused insulating layers (e.g., ceramic layers) having conductor traces disposed therebetween. The discrete circuit devices (e.g., integrated circuits) are commonly mounted on the top insulating layer so as not to be covered by another insulating layer or on a insulating layer having die cutouts formed thereon to provide cavities for the discrete devices. Passive components such as capacitors and resistors can be formed on the same layer that supports the discrete devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive material, whereby the conductive material is in contact with predetermined conductive traces between the layers that extend over or under the vias.

Unitized multilayer circuit structures are commonly made pursuant to co-fired technology wherein a unitized multilayer circuit module is made from layers of pyrolyzable dielectric tape (comprising for example a ceramic material) known in the art as "green tape". Generally, each of the green tape layers of a particular module is punched and screen printed to include a predetermined pattern of conductive vias, interconnecting conductive traces, and electrical components such as resistors and capacitors, or portions of capacitors. The individual screen printed green tape layers for a module are then stacked in the required order, and laminated together using a chosen temperature and pressure. The laminated structure is then fired at an elevated temperature. Such co-fired technology has been implemented with low temperature co-fired ceramic (LTCC) as well as with high temperature co-fired ceramic (HTCC).

Examples of low temperature co-fired processing can be found in "Development of a Low Temperature Co-fired Multilayer Ceramic Technology," by William A. Vitriol et al., 1983 ISHM Proceedings, pages 593–598; "Processing and Reliability of Resistors Incorporated Within Low Temperature Co-fired Ceramic Structures," by Ramona G. Pond et al., 1986 ISHM Proceedings, pages 461–472; and "Low Temperature Co-Fireable Ceramics with Co-Fired Resistors," by H. T. Sawhill et al., 1986 ISHM Proceedings, pages 268–271.

After a multilayer circuit structure is assembled and fired, circuit devices are placed on the multilayer circuit structure and secured thereto, for example on the top layer thereof or on the exposed surfaces of one or more cavities formed in the top portion of the multilayer circuit structure. The tolerance of shrinkage of LTCC during firing results in unpredictable substrate dimensions which in turn makes accurate placement of the circuit devices difficult. Such device placement is currently being performed with an optical recognition system that keys off alignment marks printed on the particular exposed surface on which a circuit device is to be placed. Although fast and accurate, optical recognition device placement systems are expensive.

SUMMARY OF THE INVENTION

It would therefore be an advantage to provide a unitized multilayer circuit structure that allows for economical placement of circuit devices thereon.

Another advantage would be to provide a unitized multilayer circuit structure that accurately defines the placement locations of circuit devices to be placed thereon despite uncertainty in the changes in the dimensions of the circuit structure that occur in the manufacture of the unitized multilayer circuit structure.

The foregoing and other advantages are provided by the invention in a unitized multilayer circuit structure that includes a plurality of planar dielectric insulating layers stacked in laminar fashion to form a substrate having sides, a first alignment groove formed in one side of the substrate, and a second alignment groove formed in another side of the substrate, whereby a placement location of a circuit device on the unitized multilayer circuit structure is defined by an intersection of first and second lines that pass through the first and second alignment grooves.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
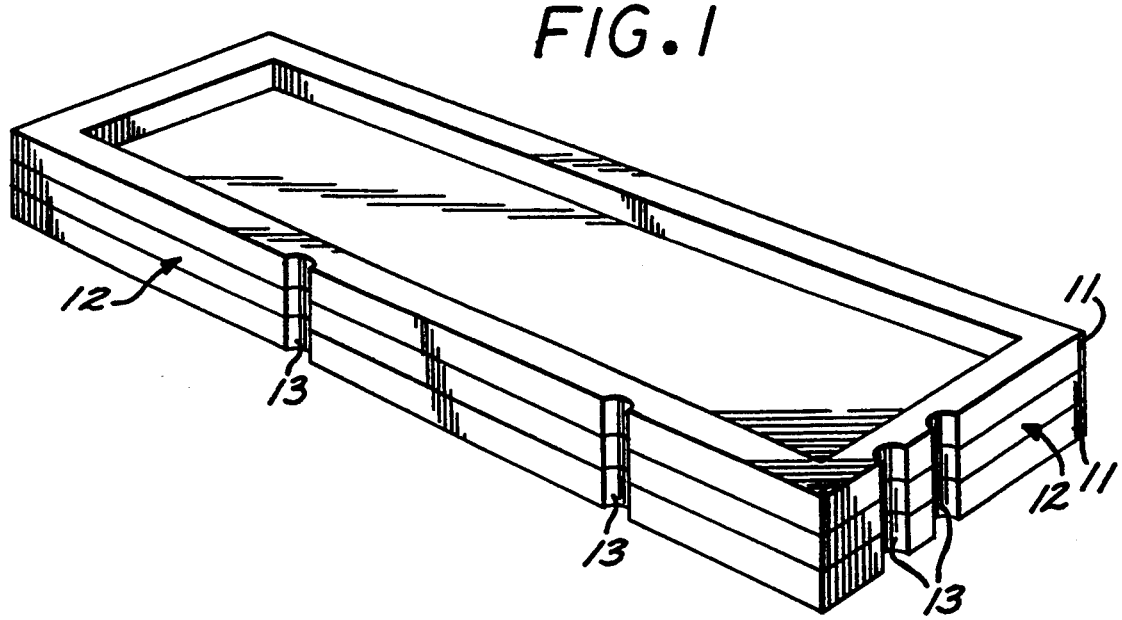
FIG. 1 is a simplified schematic illustration of a unitized multilayer circuit structure in accordance with the invention.

In the following detailed description and in the several figures of the drawing, like elements are identified with like reference numerals.

The subject invention is implemented in a unitized multilayer circuit structure that is utilized for interconnecting various discrete circuits mounted on the outside of the unitized structure. The unitized multilayer circuit structure is formed from a plurality of dielectric layers (comprising ceramic, for example), conductive traces disposed between the layers, and conductive vias formed in the layers which together with any buried elements (e.g., elements formed on the top of a dielectric layer and covered by an overlying dielectric layer) are processed to form an integrally fused unitized multilayer structure. After the unitizing fabrication, appropriate metallization, including for example ground plane metallization, is applied to the outside of the unitized structure, and the discrete circuits are mounted and electrically connected.

Referring now to FIG. 1, set forth therein is a simplified schematic illustration of a unitized multilayer circuit structure that includes alignment features in accordance with the invention. In particular, the unitized multilayer circuit structure is comprised of a plurality of planar dielectric layers 11 stacked in laminar fashion to form a substrate having sides 12 formed by edges of the dielectric insulating layers. By way of illustrative example, a cavity is formed in the top portion of the unitized multilayer circuit structure, for example by a respective opening in each of the topmost insulating layer or layers. Circuit devices are placed and secured to the exposed surface of the layer that forms the bottom of the cavity. In accordance with the invention a plurality of alignment notches or grooves 13 are formed in two of the sides 12 of the stack of dielectric layers 11 in such a manner as to define the intended placement locations of the integrated circuit chips to be placed on the unitized multilayer circuit structure. Each of the grooves 13 extends perpendicularly to the planar extent of the insulating layers and comprise, for example, respective radiused notches, as viewed in plan view, formed in edges of a plurality of contiguous dielectric layers 11.

The alignment grooves 13 can be formed by punching holes in ceramic tape layers that ultimately form the plurality of contiguous dielectric layers that contain the alignment grooves. By way of particular example, for a process wherein a plurality of circuit structures are simultaneously formed from a plurality of ceramic tape layers that are individually punched to form openings in each layer, laminarly assembled, sintered, and then sawed into individual unitized multilayer circuit structures, predetermined holes for forming the alignment grooves can be punched in the appropriate unfired ceramic tape layers along the boundaries that define adjacent multilayer structures that will ultimately become distinct unitized multilayer circuit structures. Thus, when the respective unitized multilayer circuit structures are separated from each other by sawing along the boundaries, the sides of the predetermined holes in the sintered structure are separated and become alignment grooves in the sides of the separated unitized circuit structures.

Figure 2:
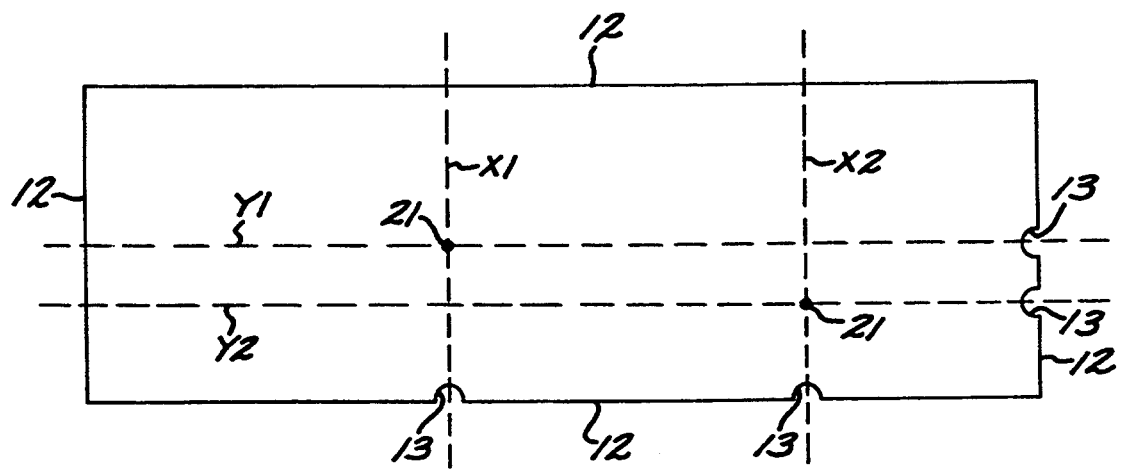
FIG. 2 is top plan sectional view illustrating the locating function provided by alignment notches of the invention.

The alignment grooves contained in the unitized multilayer circuit structure are configured to define the locations of the integrated circuit chips that are to be secured to the unitized multilayer circuit structure. For example, as illustrated in the top plan sectional view of FIG. 2, the placement location 21 of a chip can be defined by the intersection of (1) one of the lines X1, X2 that respectively pass through the innermost points of grooves in one side of the structure and are perpendicular to the such side, and (2) one of the lines Y1, Y2 that respectively pass through the innermost point of grooves in the adjacent side of the structure and are perpendicular to such side. In other words, an alignment groove in one side of the unitized multilayer circuit structure and an associated alignment groove in another side of the unitized multilayer circuit structure are coordinates that define the placement location for a circuit device on the unitized multilayer circuit structure. In terms of a rectangularly shaped unitized multilayer circuit structure, the lateral position of a chip is defined by an alignment groove in a long side of the multilayer circuit structure while the longitudinal position of a chip is defined by an alignment groove in a short side of the multilayer circuit structure.

In use, the alignment grooves 13 are optically or mechanically detected to precisely identify the placement locations of the circuit devices to be placed on the substrate. To the extent that the unitized multilayer circuit structure is long and narrow, the uncertainty in along the narrow dimension should be very small, and the long side of the circuit structure can be sufficient to provide a reference for position along the direction of the narrow dimension, in which case the alignment notches would be required only along the long dimension of the circuit structure.

The foregoing has been a disclosure of a multilayer circuit structure that accurately defines the placement locations of circuit devices to be placed thereon despite uncertainty in the changes in the dimensions of the circuit structure that occur in the manufacture of the unitized multilayer circuit structure. The disclosed multilayer circuit structure advantageously allows for economical placement of circuit devices on co-fired multilayer circuit structures without the use of expensive optical detection apparatus.

Although the foregoing has been a description and illustration of specific embodiments of the invention, various modifications and changes thereto can be made by persons skilled in the art without departing from the scope and spirit of the invention as defined by the following claims.

What is claimed is:

1. A unitized multilayer circuit structure comprising:
   a plurality of planar dielectric insulating layers stacked in laminar fashion and integrally fused to form a unitized multilayer substrate having sides formed by edges of the dielectric insulating layers; and
   an alignment groove formed in one side of said substrate, said groove comprised of respective notches in edges of a plurality of contiguous ones of said plurality of dielectric insulating layers such that said groove extends through said plurality of contiguous ones of said plurality of dielectric insulating layers.

2. A unitized multilayer circuit structure comprising:
   a plurality of planar dielectric insulating layers stacked in laminar fashion and integrally fused to form a unitized multilayer substrate having sides formed by edges of the dielectric insulating layers;
   a first alignment groove formed in one side of said substrate, said first alignment groove comprised of respective notches in edges of a plurality of contiguous ones of said plurality of dielectric insulating layers such that said first alignment groove extends through said plurality of contiguous ones of said plurality of dielectric insulating layers; and
   a second alignment groove formed in another side of said substrate, said second alignment groove comprised of respective notches in edges of said plurality of contiguous ones of said plurality of dielectric insulating layers such that said second alignment groove extends through said plurality of contiguous ones of said plurality of dielectric insulating layers.

3. A unitized multilayer circuit structure comprising:
   a plurality of planar dielectric insulating layers stacked in laminar fashion and integrally fused to form a unitized multilayer substrate having sides formed by edges of the dielectric insulating layers; and
   a plurality of alignment grooves formed in one side of said substrate, each of said plurality of alignment grooves comprised of respective notches in edges of said plurality of contiguous ones of said plurality of dielectric insulating layers such that each of said alignment grooves extends through said plurality of contiguous ones of said plurality of dielectric insulating layers.

4. A unitized multilayer circuit structure comprising:
- a plurality of planar dielectric insulating layers stacked in laminar fashion and integrally fused to form a unitized multilayer substrate having sides formed by edges of the dielectric insulating layers;
- a first plurality of alignment grooves formed in one side of said substrate, each of said first plurality of alignment groove comprised of respective notches in edges of a plurality of contiguous ones of said plurality of dielectric insulating layers such that said each of said first plurality of alignment grooves extends through said plurality of contiguous ones of said plurality of dielectric insulating layers; and
- a second plurality of alignment grooves formed in another side of said substrate, each of said second plurality of alignment .groove comprised of respective notches in edges of said plurality of contiguous ones of said plurality of dielectric insulating layers such that said each of said second plurality of alignment grooves extends through said plurality of contiguous ones of said plurality of dielectric insulating layers.

* * * * *